United States Patent
Chae

(10) Patent No.: US 7,684,250 B2
(45) Date of Patent: Mar. 23, 2010

(54) FLASH MEMORY DEVICE WITH REDUCED COUPLING EFFECT AMONG CELLS AND METHOD OF DRIVING THE SAME

(75) Inventor: Dong-hyuk Chae, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 102 days.

(21) Appl. No.: 12/045,133

(22) Filed: Mar. 10, 2008

(65) Prior Publication Data
US 2008/0225599 A1  Sep. 18, 2008

(30) Foreign Application Priority Data
Mar. 15, 2007  (KR) .................... 10-2007-0025630

(51) Int. Cl.
*G11C 16/34* (2006.01)
(52) U.S. Cl. ............................. 365/185.22; 365/185.24
(58) Field of Classification Search ............ 365/185.22, 365/185.24, 185.03
See application file for complete search history.

(56) References Cited

U.S. PATENT DOCUMENTS 7,463,531 B2 * 12/2008 Hemink et al. ......... 365/185.25

2008/0225599 A1 * 9/2008 Chae ..................... 365/185.24

FOREIGN PATENT DOCUMENTS

| JP | 08045284 | 2/1996 |
| KR | 1020010037589 A | 5/2001 |
| KR | 1020020060339 A | 7/2002 |
| KR | 1020040043363 A | 5/2004 |

* cited by examiner

*Primary Examiner*—Vu A Le
(74) *Attorney, Agent, or Firm*—Volentine & Whitt, PLLC

(57) ABSTRACT

Embodiments of the invention provide a flash memory device that can improve the reliability of a reading operation by minimizing a variation in the threshold voltage distribution that occurs due to coupling between cells, and a method of driving the flash memory device. In an embodiment of the invention, the method of driving the flash memory includes: performing an erasing operation on memory cells; after the performing the erasing operation, performing a post-programming operation to control a threshold voltage of the memory cells; and after performing the post-programming operation, performing a main programming operation on the memory cells, wherein the performing of the post-programming operation comprises increasing the threshold voltage of the memory cells in an erased state, thereby reducing a difference in the threshold voltage between the memory cells in the erased state and the memory cells in the programmed state.

20 Claims, 10 Drawing Sheets

FLASH MEMORY DEVICE WITH REDUCED COUPLING EFFECT AMONG CELLS AND METHOD OF DRIVING THE SAME

CROSS-REFERENCE TO RELATED PATENT APPLICATIONS

This application claims the benefit of Korean Patent Application No. 10-2007-0025630, filed on Mar. 15, 2007, in the Korean Intellectual Property Office, the disclosure of which is incorporated herein in its entirety by reference.

BACKGROUND OF THE INVENTION

1. Field of the Invention

The invention relates generally to a flash memory device and a method of driving the same, and more particularly, but without limitation, to a flash memory device that can minimize a variation in a threshold voltage distribution caused by coupling between cells, and a method of driving the same.

2. Description of the Related Art

Flash memories, which are widely used nonvolatile memory devices, can electrically erase or rewrite data. As compared to magnetic disk storage media such as a hard disc, a flash memory has lower power consumption and a shorter access time.

A flash memory is classified as a NOR flash memory or a NAND flash memory according to the connection between memory cells and bit lines. The NOR flash memory, in which at least two cell transistors are coupled in parallel to a single bit line, stores data according to a channel hot electron method and erases data according to a Fowler-Nordheim tunneling method. On the other hand, the NAND flash memory, in which at least two cell transistors are coupled in series to a single bit line, stores and erases data according to the F-N tunneling method. Conventionally, the NOR flash memory has a large current consumption, and thus, is disadvantageous in terms of high integration. An advantage of the NOR flash memory is the ability to cope with high-speed operation requirements. Since the NAND flash memory uses a lower cell current than the NOR flash memory, the NAND flash memory is advantageous in terms of high integration.

FIG. 1A is a circuit diagram of a memory cell structure of a conventional NAND flash memory. Referring to FIG. 1A, a plurality of word lines WL11 through WL14, and a plurality of memory cells M11 through M14 are shown. The memory cells M11 through M14 form a string structure along with selection transistors ST1 and ST2, and the memory cells M11 through M14 are coupled in series between a bit line BL and a ground voltage VSS. Since the conventional NAND flash memory uses a lower cell current than the NOR flash memory, a programming operation is performed only once on all the memory cells coupled to a single word line.

FIG. 1B is a circuit diagram of a memory cell structure of a conventional NOR flash memory. Referring to FIG. 1B, in the conventional NOR flash memory, each of the memory cells M21 through M26 are coupled between a bit line BL1 or BL2 and a common source line CSL1 or CSL2, respectively. Since the conventional NOR flash memory consumes a large amount of current during its programming operation, a predetermined number of memory cells can be programmed by a single programming operation.

Multi-level cell (MLC) technology is one method for increasing the storage capacity of flash memory. The MLC technology involves storing at least two data bits in a single cell by programming the cell using different threshold voltages. This technology is differentiated from single level cell (SLC) technology involving storing one bit in a single memory cell.

According to an MLC programming method of storing 2-bit data in each cell, each memory cell has one of these states: '11', '10', '01', and '00'. A memory cell with the state of '11' is an erased cell and has the lowest threshold voltage. A memory cell with one of the states '10', '01', and '00' is a programmed cell and has a higher threshold voltage than the cell with the state of '11'. On the other hand, according to an MLC programming method of storing 3-bit data in each cell, each memory cell has one of these states: '111', '110', '101', '100', '011', '010', '001', and '000'. A memory cell with the state of '111' is an erased cell and has the lowest threshold voltage. Memory cells in the other states are programmed cells, and have higher threshold voltages than the cell with the state of '111'.

FIG. 2 is a graphical illustration of threshold voltage distributions for each operation of a programming operation in a 2-bit multi-level cell. In FIGS. 2($a$) through 2($d$), the vertical axis represents a number of cells, and the horizontal axis represents the threshold voltage. FIG. 2($a$) illustrates an operation of programming least significant bit (LSB) data. When the operation of programming LSB data is performed, some cells have a LSB data value of "1", and other cells have an LSB data value of "0". If an LSB programming operation is performed by applying an incremental step pulse program (ISPP) to word lines, it is possible to increase a voltage interval of a step voltage in order to program LSB data at a higher speed. In this case, the programmed cells have a wide threshold voltage distribution.

Then, as shown in FIG. 2($b$), the threshold voltage distribution of the LSB programmed cells becomes wider due to coupling between adjacent cells occurring in the programming process.

FIG. 2($c$) illustrates an operation of programming most significant bit (MSB) data. From among cells with a LSB data value of "1", a cell into which a MSB data value of "0" is loaded shifts to the state of "01", and a cell into which the MSB data value of "1" is loaded remains in the state of "11". Similarly, from among cells with the LSB data value of "0", a cell into which MSB data value of "0" is loaded shifts to the state of "00", and a cell into which MSB data value of "1" is loaded shifts to the state of "10".

FIG. 2($d$) shows that the threshold voltage distribution of the MSB programmed cells widens due to a coupling effect between adjacent cells. In other words, when a cell adjacent to a specific MSB-programmed cell is MSB-programmed to vary its threshold voltage, the level of the threshold voltage of the specific MSB-programmed cell may vary due to a coupling effect between the cells. In particular, FIG. 2($d$) shows an example in which along with an increase in threshold voltage of an adjacent cell, the threshold voltage distribution of each of MSB-programmed states widens because of threshold voltage increases caused by the coupling effect between cells.

FIG. 3 is a graphical illustration of threshold voltage distributions for each operation of a programming operation in a 3-bit multi-level cell. In FIGS. 3($a$) through 3($f$), the vertical axis represents a number of cells, and the horizontal axis represents the threshold voltage. The threshold voltage distributions in FIGS. 3($a$) through ($d$) are substantially similar to those of FIGS. 2($a$) through ($d$). Through the operations illustrated in FIGS. 3($a$) to ($d$), the LSB data (hereinafter referred to as 'first data') and the MSB data (hereinafter referred to as 'second data') are programmed into memory cells.

After a second programming operation illustrated in FIG. 3(c), a third programming operation illustrated in FIG. 3(e) is performed so that 3-bit data are stored in the memory cells. As programming is performed on an adjacent cell, the threshold voltage distribution widens due to coupling between the cells, as illustrated in FIG. 3(f).

A variation in threshold voltage due to coupling between cells is proportional to a variation in threshold voltage of an adjacent cell during programming.

Referring to FIGS. 3(d) and (e), in the case of programming from "11" to "011", the variation in threshold voltage is the largest. Accordingly, the variation in threshold voltage caused by coupling between cells is relatively large when an adjacent cell is programmed from "11" to "011".

The consequence of widening threshold voltage distributions, especially in multi-level cells, is a decrease in the reliability of data reads. Accordingly, as the number of bits stored in a single memory cell increases, the reliability of the non-volatile memory device decreases. Improved flash memory devices, and methods of driving same, are therefore needed.

SUMMARY OF THE INVENTION

The present invention provides a flash memory device that can improve the reliability of reading data by minimizing a coupling effect between memory cells, and a method of driving the same.

According to an aspect of the invention, there is provided a method of driving a flash memory device, the method including: performing an erasing operation on memory cells; after performing the erasing operation, performing a post-programming operation to control a threshold voltage of the memory cells; and after the performing the post-programming operation, performing a main programming operation on the memory cells, wherein the performing of the post-programming operation comprises increasing the threshold voltage of the memory cells in an erased state, thereby reducing a difference in the threshold voltage between the memory cells in the erased state and the memory cells in the programmed state.

Another embodiment of the invention provides a method of driving a flash memory device, the method including: performing an erasing operation on memory cells to produce a first threshold voltage distribution in the memory cells; after performing the erasing operation, performing a post-programming operation on the memory cells to produce a second threshold voltage distribution in the memory cells; and after performing the post-programming operation, performing a main programming operation on the memory cells, wherein the performing of the post-programming operation comprises verifying the memory cells using a verify voltage of 0V or greater and the second threshold voltage distribution includes a threshold voltage of 0V.

The present invention also provides a flash memory device. The flash memory device includes: a memory cell array comprising multi-level cells; a word line voltage generating unit coupled to the memory cell array and configured to output a word line voltage that is to be applied to the memory cell array; a control logic coupled to the word line voltage generating unit and configured to control a programming operation and a read operation on the memory cell array, the programming operation including an erasing operation, a post-programming operation to adjust a threshold voltage of the memory cells on which the erasing operation has been performed, and a main programming operation on the memory cells on which the post-programming operation has been performed; and a pass/fail detecting unit coupled to the control logic, the pass/fail detecting unit configured to determine whether each memory cell is in a pass state or a fail state with respect to the post-programming operation.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
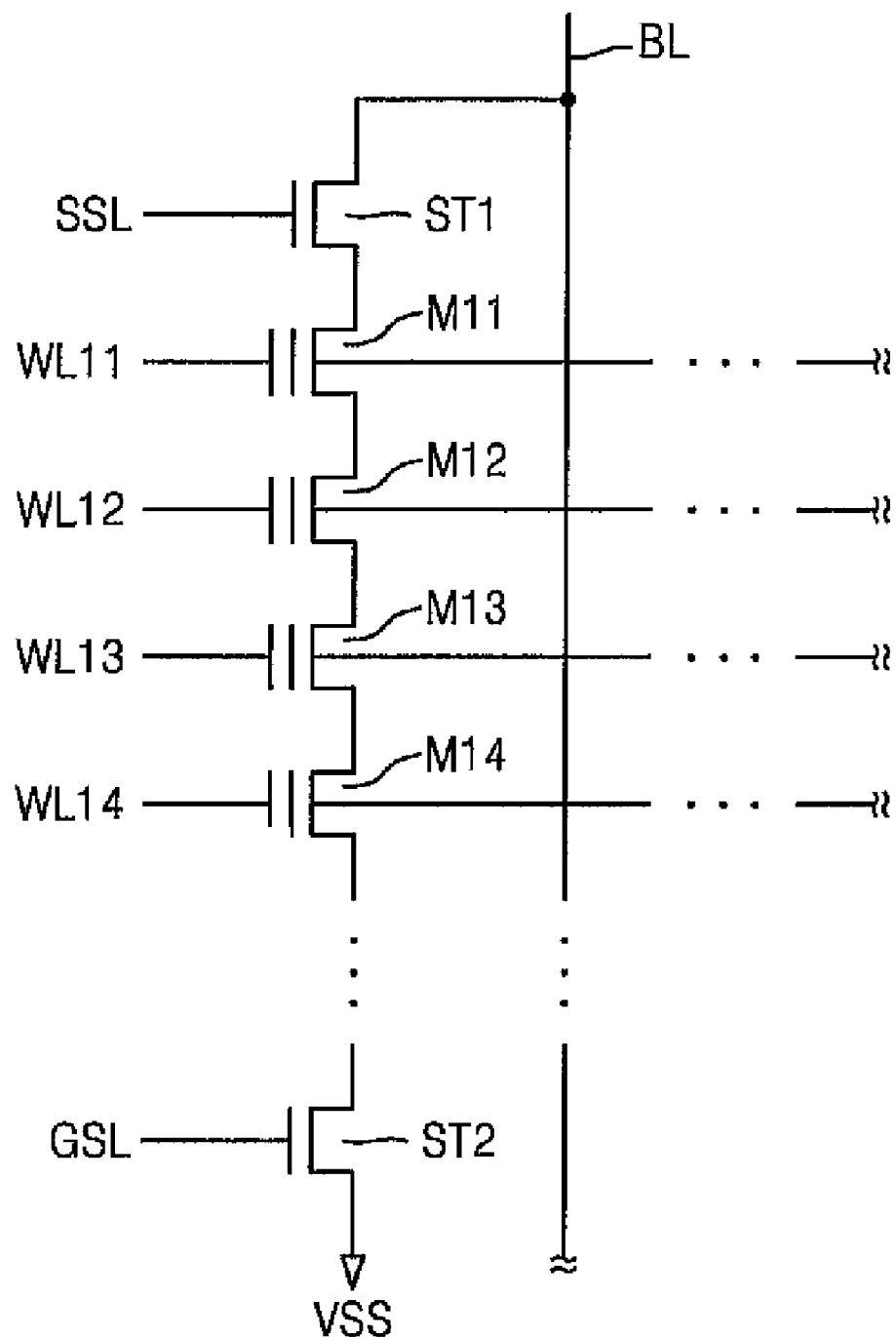
FIG. 1A is a circuit diagram illustrating a memory cell structure of a conventional NAND flash memory.
Figure 1B:
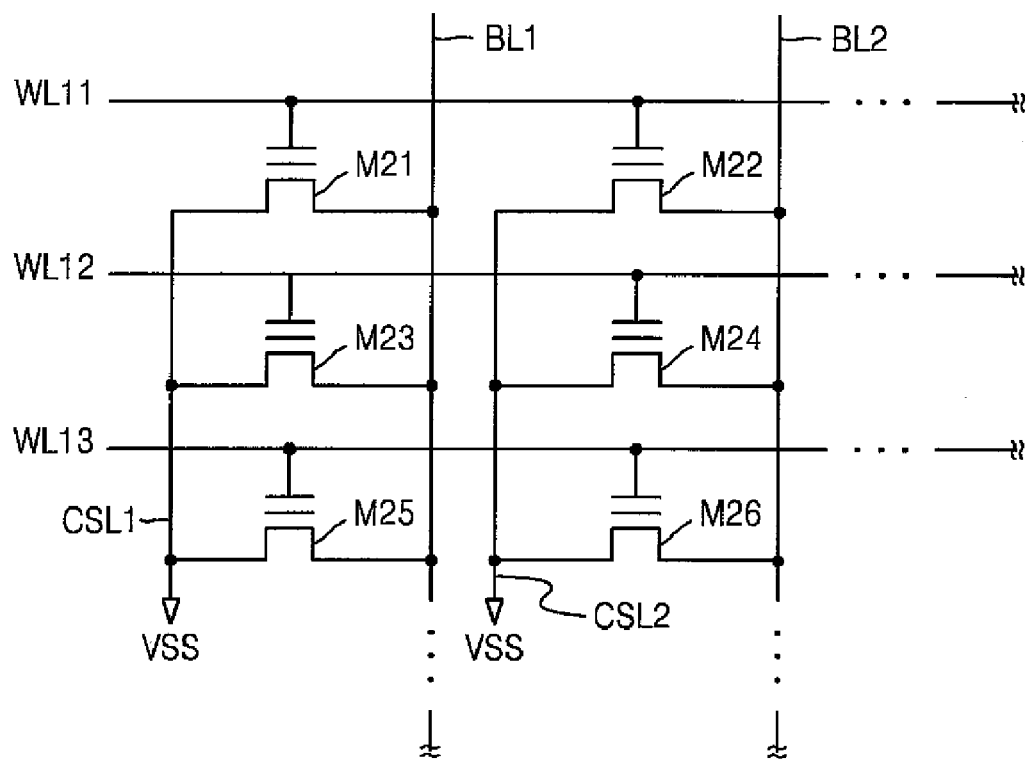
FIG. 1B is a circuit diagram illustrating a memory cell structure of a conventional NOR flash memory.
Figure 2:
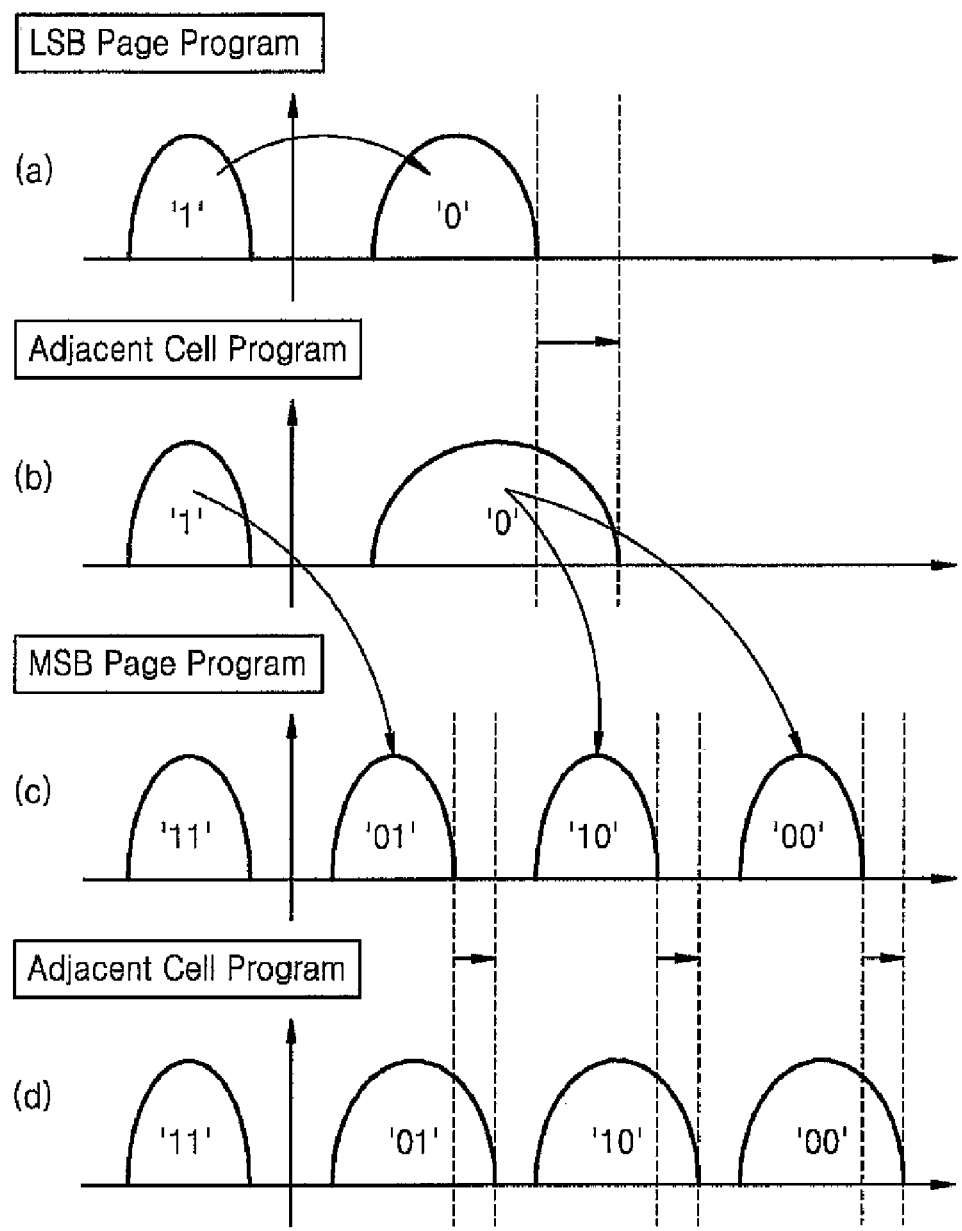
FIG. 2 is a graphical illustration of threshold voltage distributions for each operation of a programming operation in a 2-bit multi-level cell.
Figure 3:
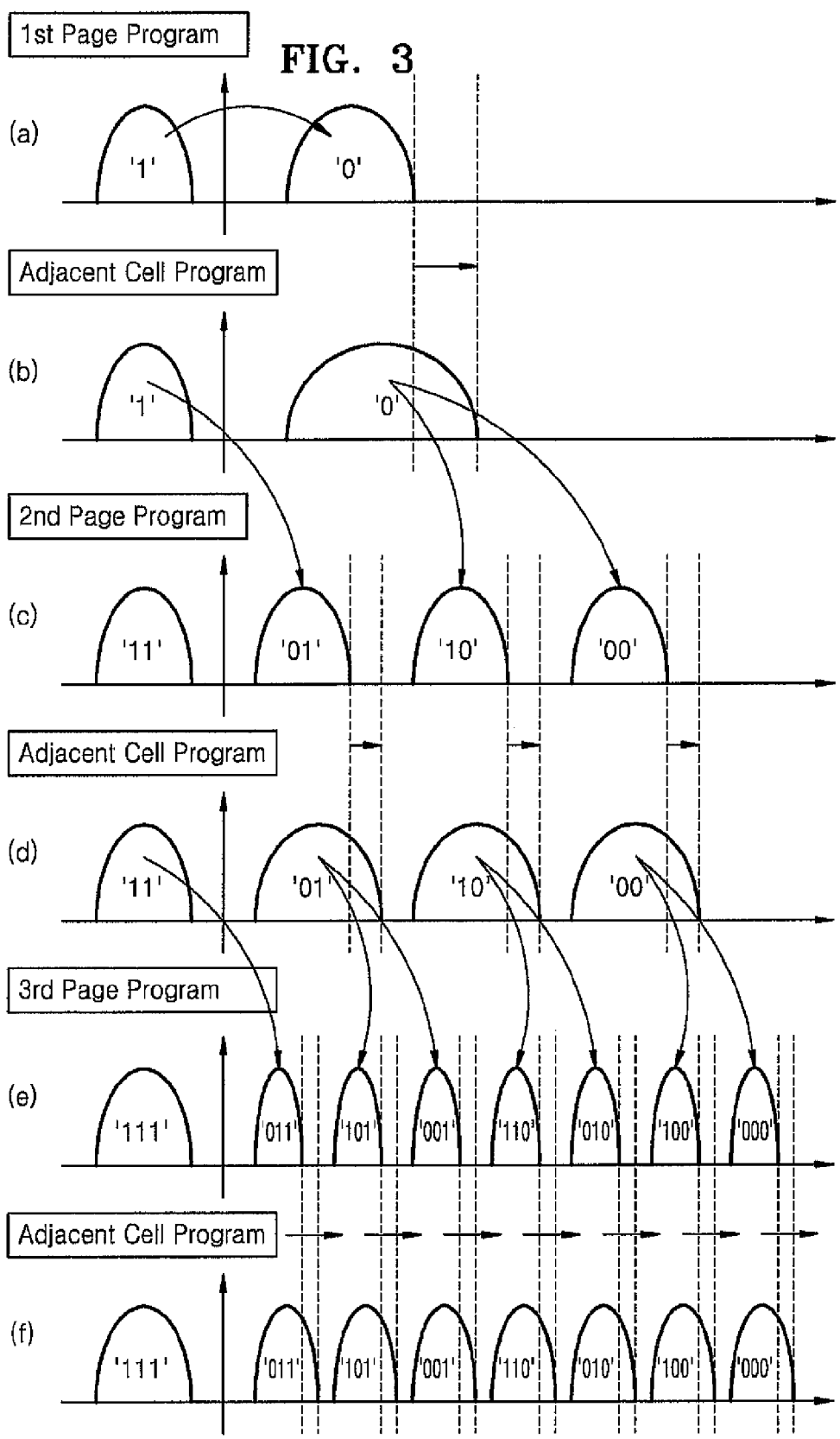
FIG. 3 is a graphical illustration of threshold voltage distributions for each operation of a programming operation in a 3-bit multi-level cell.

Hereinafter, the invention will be described in detail by explaining exemplary embodiments of the invention with reference to the attached drawings. Like reference numerals in the drawings denote like elements.

Figure 4:
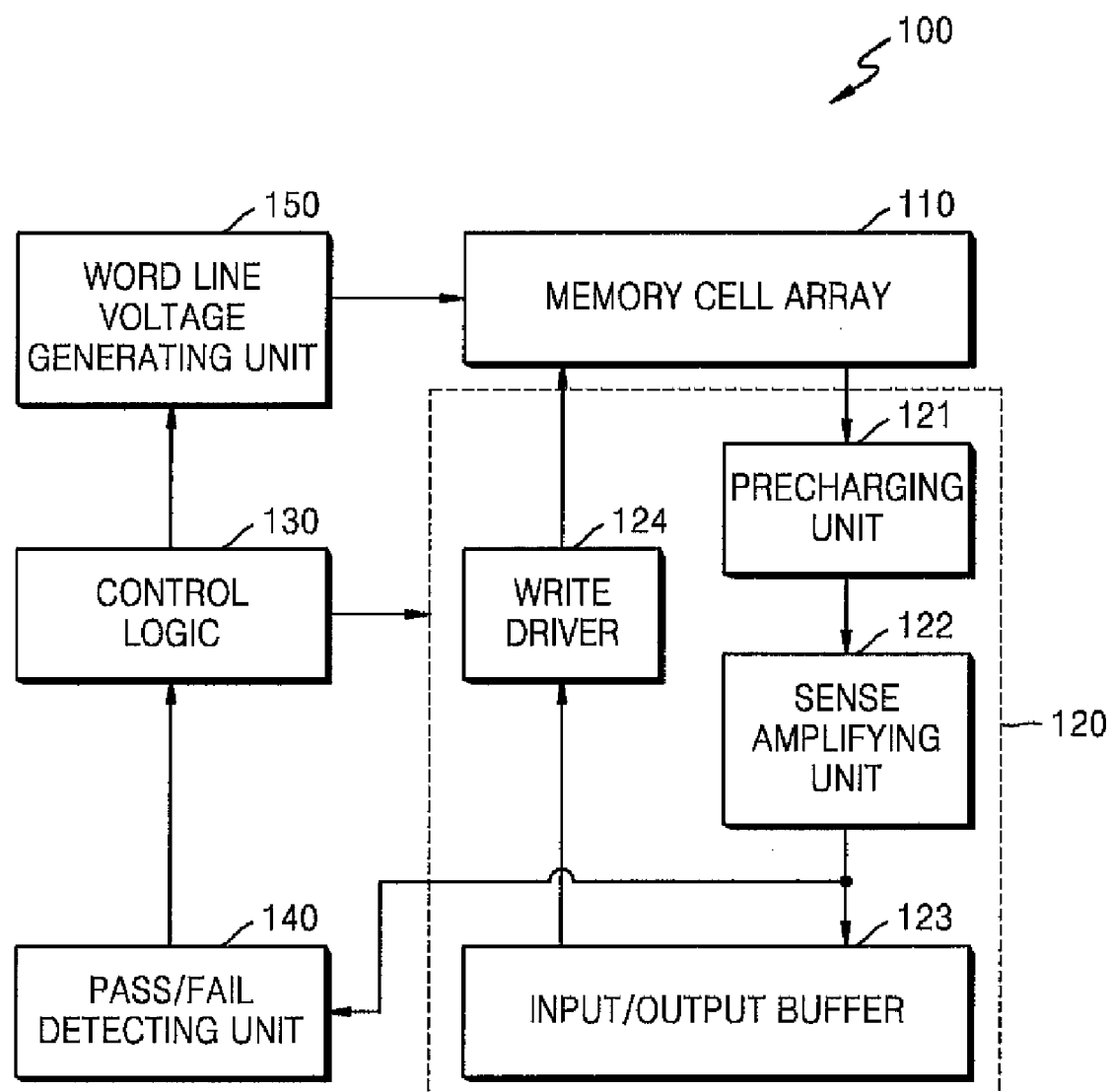
FIG. 4 is a block diagram of a flash memory device according to an embodiment of the invention.

FIG. 4 is a block diagram of a flash memory device 100 according to an embodiment of the invention. Referring to FIG. 4, the flash memory device 100 may include a memory cell array 110, and a peripheral circuit 120 configured to perform a programming operation or a read operation on the memory cell array 110. The peripheral circuit 120 may include a pre-charging unit 121, a sense amplifying unit 122, an input/output buffer 123, and a write driver 124.

In addition, the flash memory device 100 includes a control logic 130 configured to control the programming operation or read operation of the memory cell array 110. The flash memory device 100 also includes a pass and fail detecting unit 140 configured to determine whether each memory cell on which the programming operation has been performed is in a pass state or a fail state by receiving an output of the sense amplifying unit 122. The flash memory device 100 further includes a word line voltage generating unit 150 configured to output a voltage to word lines in the memory cell array 110.

The memory cell array 110 includes multi-level cells (MLCs). A margin between the threshold voltages of cells in different data states is required to provide reliable read operation. However, as the size of the MLC memory cell array 110 decreases, a coupling affect between cells increases so that the margin between threshold voltages is not sufficient to ensure reliable read operation. To prevent this cause and effect, the control logic 130 performs a post-programming operation on the MLCs of the memory array 110 that is described below with reference to FIG. 5.

Figure 5A:
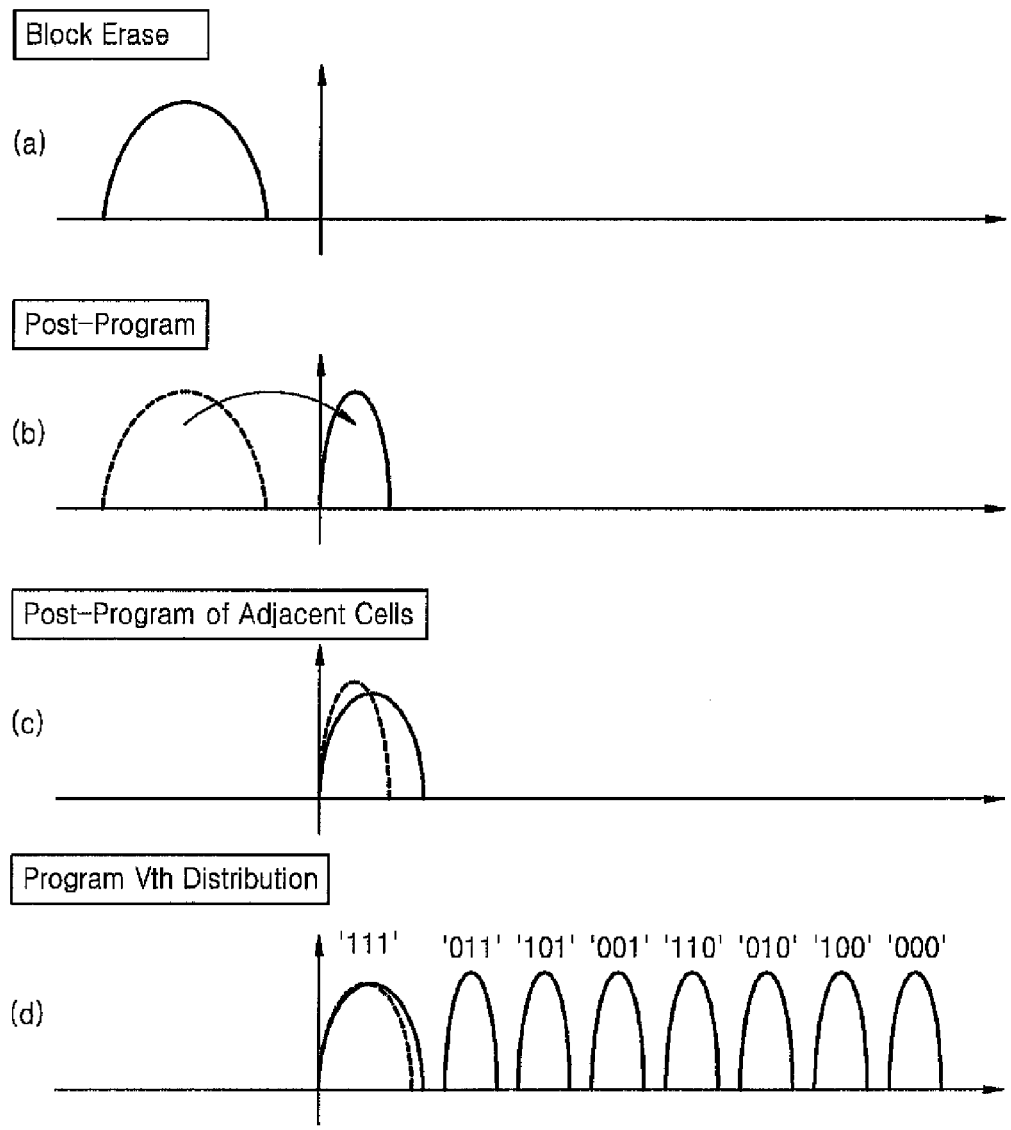
FIG. 5A is a graphical illustration of threshold voltage distributions for each operation of a multi-level cell programming operation, according to an embodiment of the invention in the flash memory device of FIG. 4.
Figure 5B:
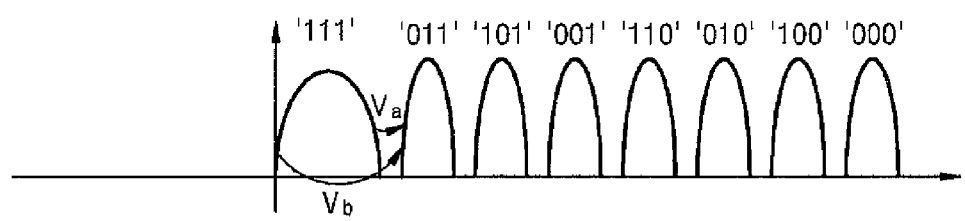
FIG. 5B is a graphical illustration of threshold voltage distributions showing voltage levels that induce coupling between cells, according to an embodiment of the invention.

FIG. 5A is a graphical illustration of threshold voltage distributions for each operation of a multi-level cell programming operation in the flash memory device of FIG. 4, according to an embodiment of the invention. FIG. 5B is a graphical illustration of threshold voltage distributions showing voltage levels that induce coupling between cells, according to an embodiment of the present invention.

As shown in FIG. 5A (a), to program the memory cell array 110 of the flash memory device 100, an erasing operation is performed on the memory cells in predetermined units, for example, in blocks. After the erasing operation has been performed on the memory cells, the memory cells have a wide threshold voltage distribution. Conventionally, the threshold voltage distribution after the erasing operation has been performed is wide in a negative voltage region of about −3V.

The control logic 130 in FIG. 4 controls the peripheral circuit 120, which performs a programming operation or read operation. In particular, the control logic 130 causes the peripheral circuit 120 to perform a post-programming operation on the memory cells of the memory cell array 110. The post-programming operation is performed after an erasing operation and before a main programming operation. The post-programming operation reduces the threshold voltage distribution of the memory cells as compared to the threshold voltages in the erased state. In addition, the post-programming operation increases the threshold voltage level of all cells.

The solid curve in FIG. 5A (b) shows a threshold voltage distribution of the memory cells after the post-programming operation has been performed. At completion of the post-programming step, the threshold voltage level in the erased state (equivalent to the data state of "111") is greater than that of cells on which the post-programming has not been performed. As illustrated, the memory cells on which the post-programming operation has been performed may have a threshold voltage of 0V or greater. In this case, when a verifying operation for the post-programming is performed, a verify voltage having 0V or greater can be applied to a word line. A verifying operation is performed by applying the verify voltage to a word line of the memory cell array 110. Because the verify voltage is 0v or greater, there is no need for a charging pump that generates a negative voltage.

To narrow the threshold voltage distribution of the memory cells in the erased state, a step voltage with a small voltage interval may be applied to the memory cell array 110 during the post-programming operation. The solid curve in FIG. 5A(b) illustrates the narrow threshold voltage distribution in the erased state.

FIG. 5A (c) illustrates the effect of a post-programming operation on an adjacent cell. As a threshold voltage of the adjacent cell increases through the post-programming operation, the threshold voltage distribution in the erased state widens (from the dashed curve to the solid curve) due to the coupling effect between adjacent cells.

FIG. 5A (d) illustrates a threshold voltage distribution of the memory cells on which the main programming operation has been performed. The main programming operation is executed after the post-programming operation illustrated in FIG. 5A (c). As illustrated in FIG. 5A (d), the threshold voltage distribution in the erased state (equivalent to the data state of "111") can further widen due to coupling between cells as the main-programming operation is performed on an adjacent cell.

As described above, the variation in the threshold voltage caused by coupling between cells is proportional to the variation in threshold voltage of the adjacent cell. In particular, in the case of programming an adjacent cell, the variation in threshold voltage is largest when the adjacent cell is programmed from the data state of "111" to the data state of "011". However, as illustrated in (d) of FIG. 5A, the threshold voltage distribution in the erased state (equivalent to the data state of "111") starts at around 0V or greater because of the post-programming operation. Accordingly, a difference in threshold voltage between the data states of "111" and "011" decreases, thereby reducing a variation in the threshold voltage of an adjacent cell during a main programming operation. As a result, the variation in the threshold voltage caused by coupling between cells decreases, and the threshold voltage distribution in each data state narrows. Accordingly, a sufficient margin can be ensured between the threshold voltages in different data states.

FIG. 5B is a graphical illustration of threshold voltage distributions for a programming operation from the data state of "111" to "011" according to an embodiment of the invention. As shown in FIG. 5B, when programming is performed from the data state of "111" to "011", the threshold voltage changes by approximately Va-Vb. The variation in threshold voltage is less than in a conventional case of programming from the data state "111" to "011". Accordingly, the variation in threshold voltage due to coupling between cells is reduced, thereby narrowing the threshold voltage distribution in each data state.

In addition, when performing a post-programming operation, a verify voltage, which is required for a verifying operation, may be set to 0V or greater. Accordingly, as compared with the case of verifying using a negative voltage, there is no need for a charging pump that generates a negative voltage.

Figure 6:
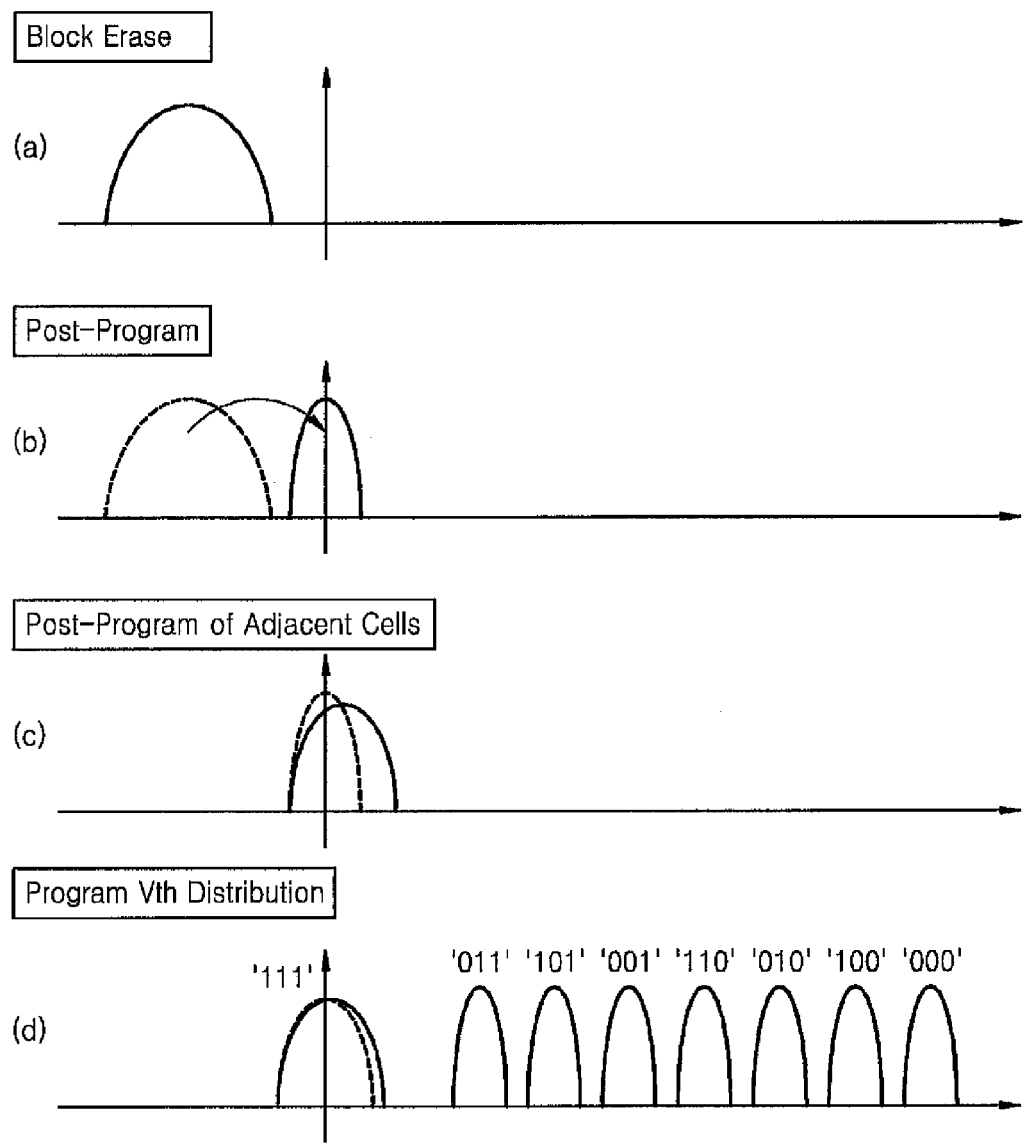
FIG. 6 is a graphical illustration of threshold voltage distributions for each operation of a multi-level cell programming operation in the flash memory device of FIG. 4, according to another embodiment of the invention.

FIG. 6 is an illustration of threshold voltage distributions for each operation of a multi-level cell programming operation of the flash memory device of FIG. 4, according to another embodiment of the invention. As illustrated in FIG. 6, when programming the memory cells, a post-programming operation is performed after an erasing operation and before a main programming operation. As a result of the post-programming operation, the threshold voltage distribution in an erased state (equivalent to the data state of "111") is in a range including 0V.

When programming a multi-level cell (MLC) that stores multiple bits in a single cell, a margin between the threshold voltage distributions in different data states may be widened so as to make it easier to distinguish one data state from another in a read operation. In FIG. 5A, the threshold voltage distribution in an erased state (equivalent to the data state of "111") starts at a 0V or greater as a result of the post-programming operation. Because the post-programming operation in FIG. 6 includes a threshold voltage distribution in the erased state and below 0V, the margin between the threshold voltages in programmed data states in FIG. 6 may be wider rather than that in case of FIG. 5A.

In order to widen the margin between the threshold voltages in programmed data states, the width of the threshold voltage distribution in the erased state (equivalent to the data state of "111") may be narrowed. To achieve this, an interval of a step voltage applied to a word line in the post-programming operation should be small, which prolongs the time required for the post-programming operation. Accordingly, with a verify voltage of 0V or greater, it is preferable to shift the threshold voltage distribution of the memory cells on which the post-programming operation has been performed to the left (i.e., in the negative direction of horizontal axis), as compared to the case of FIG. 5A.

Prior to performing a main programming operation on the memory cells, an erasing operation is performed on the memory cells so that the memory cells have a threshold voltage distribution as shown in FIG. 6(*a*). Then, a post-programming operation is performed to control the threshold voltage distribution in the erased state (equivalent to the data state of "111"), and in particular, so that the threshold voltage distribution range includes 0V, as indicated by the solid curve in FIG. 6(*b*). As illustrated in FIG. 6 (*d*), after the main programming operation has been performed, there is a large margin between the threshold voltage distribution in the erased state (equivalent to the data state of "111") and the threshold voltage distribution in the next nearest data state (i.e., the "011" data state).

Figure 7:
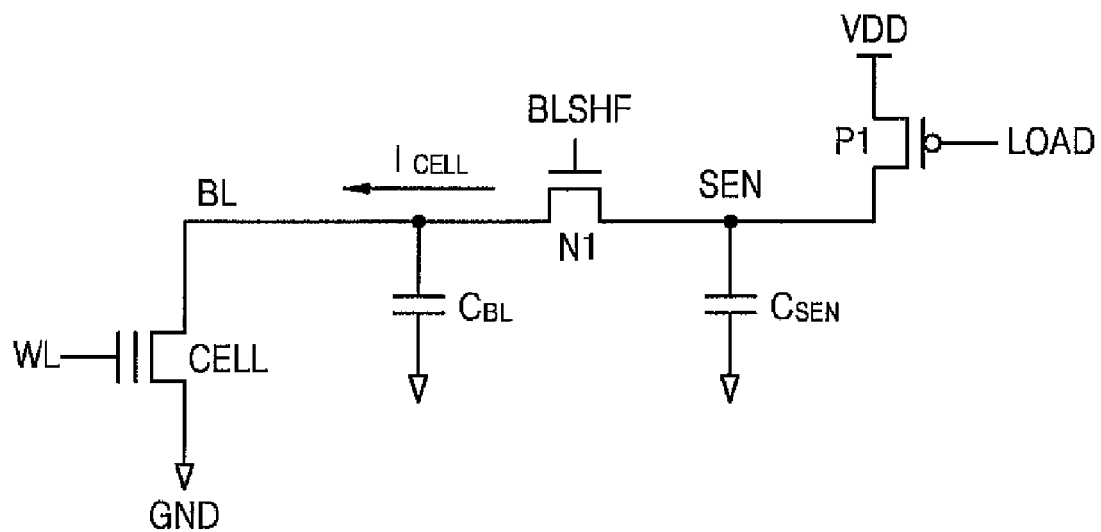
FIG. 7 is a circuit diagram for a portion of a flash memory device, according to an embodiment of the present invention.
Figure 8:
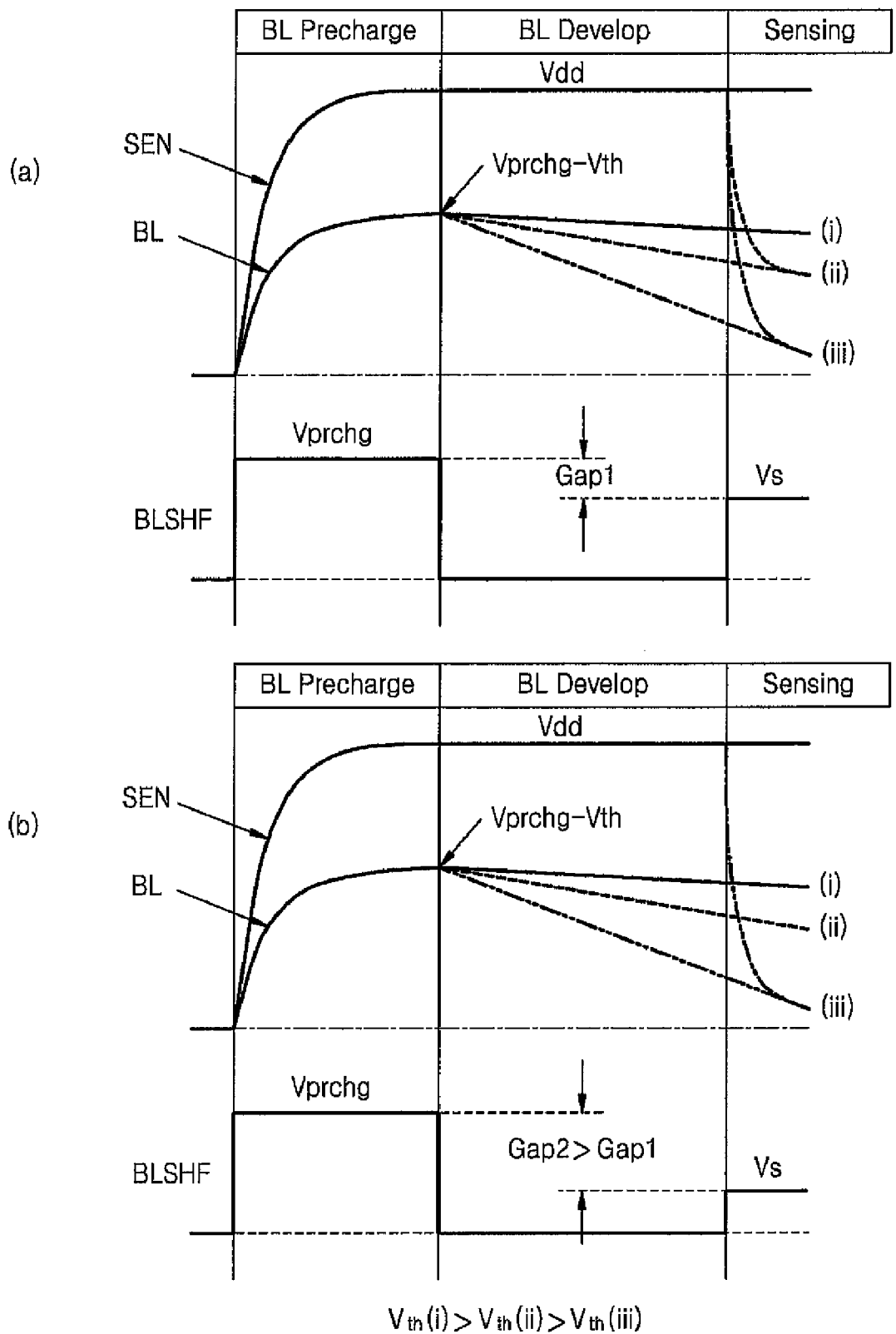
FIG. 8 is a waveform diagram illustrating various node voltages involved in a read operation of the circuit in FIG. 7.

FIGS. 7 and 8 describe a verifying operation that is performed subsequent to the post-programming operation illustrated in FIG. 6(*b*).

FIG. 7 is a circuit diagram of a portion of a flash memory device, according to an embodiment of the invention. FIG. 8 is a waveform diagram illustrating various node voltages of the circuit in FIG. 7, according to an embodiment of the invention.

As illustrated in FIG. 7, a PMOS transistor P1 and an NMOS transistor N1 may be connected to a memory cell CELL and a bit line BL. The PMOS transistor P1 is included in the pre-charging unit 121 as shown in FIG. 4, and the NMOS transistor N1 is included in the sense amplifying unit 122. If performing a read operation on the memory cell CELL, the bit line BL is pre-charged to a predetermined voltage, and the voltage of the bit line BL is developed according to a threshold voltage state of the memory cell CELL.

The PMOS transistor P1 is controlled according to a control signal LOAD to pre-charge the sensing node SEN to a predetermined level. The NMOS transistor N1 is controlled according to a shutoff control signal BLSHF to electrically connect or disconnect the bit line BL and the sensing node SEN. The capacitor CBL represents the capacitance of the bit line BL, and capacitor CSEN represents the capacitance of the sensing node SEN. Conventionally, the capacitance CBL of the bit line BL has a greater value than the capacitance CSEN of the sensing node SEN. The sense amplifying unit 122 senses and amplifies the voltage of the sensing node SEN and outputs the result as read data to the input/output buffer 123.

FIG. 8 is a waveform diagram illustrating various node voltages involved in a read operation of the circuit in FIG. 7.

FIG. 8(*a*) shows a voltage level of the sensing node SEN, a voltage level of the bit line BL, and a voltage level of the shutoff control signal BLSHF in a conventional read operation. In order to perform a read operation on programmed memory cells, initially the bit line BL is pre-charged. In a bit line pre-charge interval, the bit line control signal LOAD changes to a low level and turns the PMOS transistor P1 on, thereby pre-charging the voltage of the sensing node SEN to a power voltage VDD. In addition, the shutoff control signal BLSHF is activated to a pre-charge level Vprchg, and the bit line BL is pre-charged to a level Vprchg-Vth that is equivalent to a difference between a gate voltage Vprchg and a threshold voltage Vth of the NMOS transistor N1.

In the following bit line develop interval, the voltage of the shutoff control signal BLSHF is disabled to 0V. In addition, as the bit line BL is discharged by a cell current ICELL, the voltage level of the bit line decreases. FIG. 8(*a*) shows a developing state of the bit line BL for memory cells CELL having three different threshold voltages. In particular, curve (i) indicates a develop state of the bit line voltage for a memory cell CELL having the largest threshold voltage, curve (iii) indicates a develop state of the bit line voltage for a memory cell CELL having the smallest threshold voltage, and curve (ii) indicates a develop state of the bit line voltage for a memory cell CELL having an intermediate threshold voltage.

In the case of curve (i), the threshold voltage of the memory cell CELL having the largest threshold voltage is greater than a voltage applied to the word line of the memory cell CELL, so that almost zero cell current flows. Accordingly, in the bit line develop interval, the voltage level of the bit line BL declines only slightly. On the other hand, in the case of curve (iii), the cell current is largest, so that the voltage level of the bit line BL declines dramatically. In the case of curve (ii), the threshold voltage of the memory cell CELL having the intermediate threshold voltage is greater than that of the memory cell CELL having the smallest threshold voltage as seen in curve (iii), so that a smaller cell current flows. Accordingly, in curve (ii), a drop in voltage of the bit line BL is less than that of as seen in curve (iii).

A sensing interval follows the bit line develop interval. During the sensing interval, a voltage level of the shutoff control signal BLSHF that is applied to a gate of the NMOS transistor N1 is equivalent to a sensing voltage Vs. As shown in FIG. 8(*a*), there is a difference of a Gap1 between the level of the pre-charge voltage Vprchg and the level of the sensing voltage Vs. In the case of (i), since the voltage level of the bit line BL is high, the NMOS transistor N1 turns off even if the shutoff control signal BLSHF is activated. Accordingly, the voltage of the sensing node SEN remains at the level of the power voltage VDD. On the other hand, in the cases of curves (ii) and (iii), the voltage level of the bit line BL drops to a voltage of Vs-Vth, or less, so that the NMOS transistor N1 turns on during the sensing interval. Accordingly, the voltage level of the sensing node SEN drops to a level equal to the voltage of the bit line BL.

FIG. 8(*b*) shows a voltage level of the sensing node SEN, a voltage level of the bit line BL, and a voltage level of the shutoff control signal BLSHF in a post-programming verifying operation. The verifying operation is a reading operation performed on the memory cell CELL. The features of the bit line pre-charge interval and the bit line develop interval during the post-programming verifying operation are the same as in the conventional read operation described above with reference to FIG. 8 (*a*).

During the sensing interval of a verifying operation, however, the level of the sensing voltage Vs is set lower than in the conventional read operation. Thus, Gap 2, which is the difference between the pre-charge voltage Vprchg and the sensing voltage Vs applied to the NMOS transistor N1, is greater than the Gap 1 difference illustrated in FIG. 8(*a*). With reference to FIG. 8(*b*), curve (ii) where the voltage of the bit line BL is greater than the voltage Vs-Vth, the memory cell CELL is recognized as an "OFF" cell.

By controlling the Gap 2 difference, the threshold voltage of the memory cell CELL can be read to be higher or lower than an actual threshold voltage of the memory cell CELL. In other words, if the Gap2 is set to a large value when verifying the post-programming operation, the memory cell CELL, which is actually an "ON" cell, can be read as an "OFF" cell, so that the threshold voltage of the memory cell can be read as a greater value than an actual value. According to the method described above, the threshold voltage distribution of memory cells after a post-programming operation can be set to be lower than a verify voltage that is actually applied to the word line of the memory cells. For example, as shown in FIG. 6(b), the verify voltage may be set to 0V, and the threshold voltage distribution of the post-programmed memory cells may range in a region including 0V.

Figure 9:
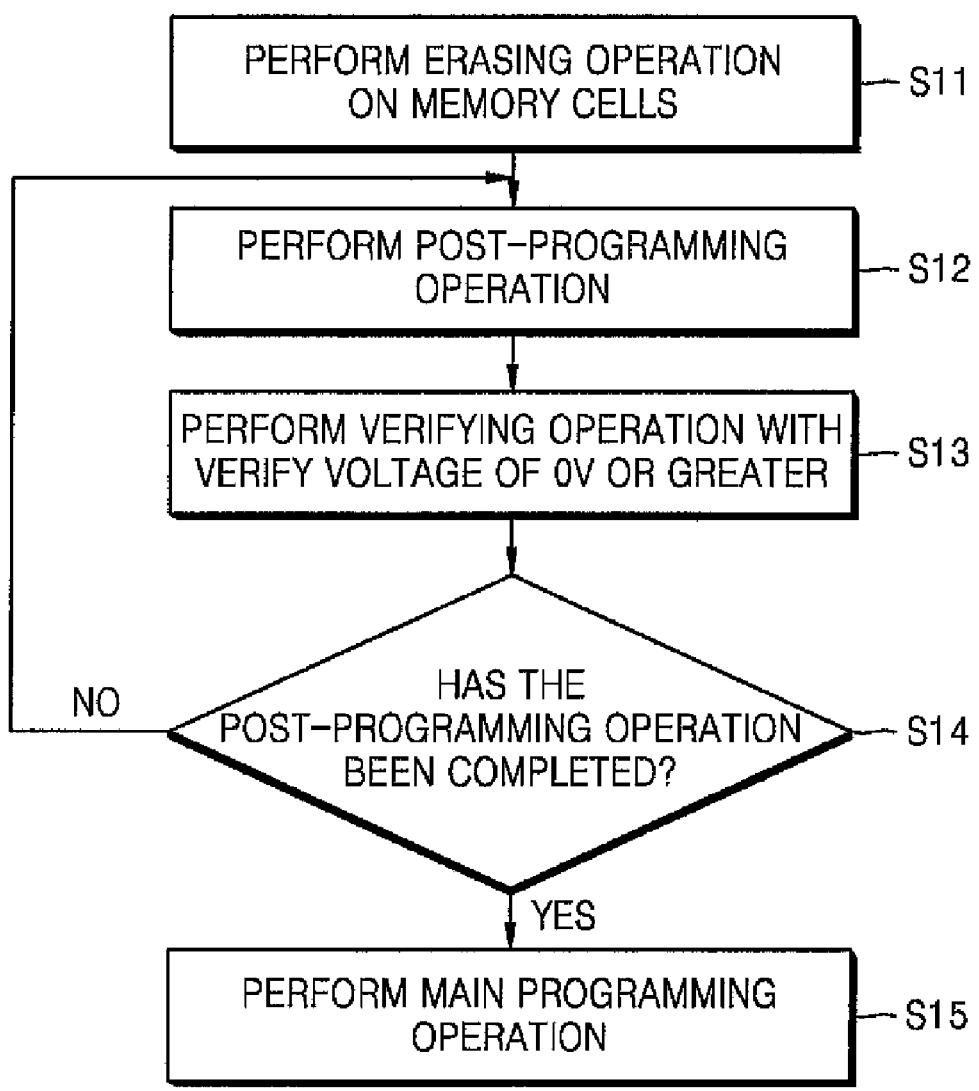
FIG. 9 is a flowchart of a method for driving a flash memory device according to an embodiment of the invention.

FIG. 9 is a flowchart of a method for driving a flash memory device according to an embodiment of the present invention.

Referring to FIG. 9, in order to perform a programming operation on a memory cell array in a flash memory device, an erasing operation is performed on the memory cells (Operation S11). As a result of the erasing operation on the memory cells, the memory cells have a first threshold voltage distribution in a negative voltage region.

After the erasing operation has been performed, in order to control a threshold voltage of the memory cells on which the erasing operation has been performed, a post-programming operation is performed (Operation S12). This post-programming operation is performed to increase the threshold voltage of the memory cells in an erased state, and thus, to reduce a difference between the threshold voltage of the memory cells in the erased state and the threshold voltage of the memory cells in the programmed state. An interval of a step voltage that is applied to the word line of the memory cells may be set small enough to narrow the threshold voltage distribution of the memory cells on which the post-programming operation has been performed.

Once the post-programming operation has been performed, a verifying operation is performed on the memory cells (Operation S13). In this verifying operation, a verify voltage that is applied to the word line of the memory cells is set to be 0V or greater. In embodiments of the invention, the verify voltage may be set to 0V.

As a result of the verifying operation, memory cells having a threshold voltage of 0V or greater are determined (in Operation S14) to be in a pass state, so that a further post-programming operation on the memory cells in the pass state is inhibited from being performed. On the other hand, memory cells having a threshold voltage less than 0V as a result of the verifying operation are determined (in Operation S14) to be in a fail state, so that the post-programming operation is repeated on the memory cells in the fail state until the memory cells are verified to be in the pass state. As a result of the post-programming operation, the threshold voltage distribution of the memory cells starts at 0V or greater.

Once the post-programming operation has been completed (as determined in Operation S14), a main programming operation is performed on the memory cells (Operation S15). In particular, once the post-programming operation has been completed, the memory cells have a second threshold voltage distribution. The main programming operation is performed on the memory cells having the second threshold voltage distribution. As a result, a difference between the threshold voltage level of the memory cells in an erased state (for example, equivalent to the data state of "111") and the threshold voltage level of the memory cells in a programmed state decreases, thereby suppressing a coupling between memory cells that occurs in proportion to the variation in threshold voltage of an adjacent memory cell. Accordingly, a threshold voltage margin between different data states increases, thereby improving reliability in a read operation. In addition, since the post-programming operation is verified with a verify voltage of 0V or greater, the programming operation can be performed without the need for a charging pump that generates a negative voltage. In addition, although not illustrated in the flowchart of FIG. 9, it is possible to control the second threshold voltage distribution to be in a voltage region including 0V based on the above description even with a verify voltage of 0V or greater.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. A method of driving a flash memory device, the method comprising:
   performing an erasing operation on memory cells;
   after the performing the erasing operation, performing a post-programming operation to control a threshold voltage of the memory cells; and
   after the performing the post-programming operation, performing a main programming operation on the memory cells,
   wherein the performing of the post-programming operation comprises increasing the threshold voltage of the memory cells in an erased state, thereby reducing a difference in the threshold voltage between the memory cells in the erased state and the memory cells in the programmed state, and
   the threshold voltage of at least one of the memory cells on which the post-programming operation has been performed is 0V or greater.

2. The method of claim 1, wherein the post-programming operation is a programming operation using an Incremental Step Pulse Programming (ISPP) method.

3. The method of claim 2, wherein the performing of the post-programming operation comprises controlling the width of a threshold voltage distribution of the memory cells to be narrower by controlling a step voltage associated with the ISPP method.

4. The method of claim 1, wherein the threshold voltage of all of the memory cells on which the post-programming operation has been performed is 0V or greater.

5. The method of claim 1, wherein the performing of the post-programming operation comprises applying a verify voltage of 0V or greater to a word line of the memory cells.

6. The method of claim 5, wherein the performing of the post-programming operation comprises applying in a verifying operation a verify voltage of 0V or greater to a word line of the memory cells.

7. A method of driving a flash memory device, the method comprising:
   performing an erasing operation on memory cells to produce a first threshold voltage distribution in the memory cells;
   after performing the erasing operation, performing a post-programming operation on the memory cells to produce a second threshold voltage distribution in the memory cells; and
   after performing the post-programming operation, performing a main programming operation on the memory cells,
   wherein the performing of the post-programming operation comprises verifying the memory cells using a verify voltage of 0V or greater and the second threshold voltage distribution includes a threshold voltage of 0V.

8. The method of claim 7, wherein the second threshold voltage distribution ranges from a first voltage or to a second voltage, the first voltage having a negative value and the second voltage having a positive value.

9. The method of claim 8, wherein the performing of the post-programming operation comprises applying a verify voltage of 0V to a word line of the memory cells.

10. The method of claim 8, wherein the first voltage is greater than the first threshold voltage distribution, and the second voltage is less than a threshold voltage of the memory cells after the performing the main programming operation.

11. The method of claim 7, wherein the performing of the post-programming operation is carried out according to an Incremental Step Pulse Programming (ISPP) method.

12. The method of claim 7, wherein the verifying the memory cells comprises:
pre-charging a bit line and a sensing node associated with the memory cells using a pre-charge voltage;
developing the voltage level of the pre-charged bit line; and
sensing a voltage level of the sensing node to determine whether each memory cell is in a pass state or a fail state, the fail state indicative of a memory cell having a threshold voltage of less than 0V, the pass state being different than the fail state, the sensing performed using a sensing voltage.

13. The method of claim 12, wherein verifying the memory cells comprises controlling the second threshold voltage distribution by controlling the difference between the precharge voltage and the sensing voltage.

14. A flash memory device comprising:
a memory cell array comprising multi-level cells;
a word line voltage generating unit coupled to the memory cell array and configured to output a word line voltage that is to be applied to the memory cell array;
a control logic coupled to the word line voltage generating unit and configured to control a programming operation and a read operation on the memory cell array, the programming operation including an erasing operation, a post-programming operation to adjust a threshold voltage of the memory cells on which the erasing operation has been performed, and a main programming operation on the memory cells on which the post-programming operation has been performed; and
a pass/fail detecting unit coupled to the control logic, the pass/fail detecting unit configured to determine whether each memory cell is in a pass state or a fail state with respect to the post-programming operation.

15. The flash memory device of claim 14, wherein the generating unit is configured to output the word line voltage using a step voltage associated with an Incremental Step Pulse Program (ISPP) during the post-programming operation.

16. The flash memory device of claim 15, wherein the word line voltage generating unit is configured to generate the step voltage with a small voltage interval during the post-programming operation so as to narrow a threshold voltage distribution of the memory cells.

17. The flash memory device of claim 14, wherein the word line voltage generating unit is configured to output the word line voltage in a range of 0V or greater in a verifying operation.

18. The flash memory device of claim 14 further comprising a peripheral circuit coupled to the memory cell array, the control logic, and the pass/fail detecting unit, the peripheral circuit configured to program data onto the memory cell array, the peripheral circuit further configured to read data from the memory cell array.

19. The flash memory device of claim 18, wherein the peripheral circuit comprises a pre-charging unit, the pre-charging unit including a first transistor that is controlled according to a bit line control signal, the precharging unit configured to pre-charge a bit line and a sensing node to a predetermined voltage level.

20. The flash memory device of claim 19, wherein the peripheral circuit further comprises a sense amplifying unit, the sense amplifying unit comprising a second transistor that is controlled according to a shutoff control signal, the second transistor configured to control a coupling between the bit line and the sensing node, the flash memory device configured such that the shutoff control signal has a first voltage in a bit line pre-charge interval and a second voltage in a sensing interval during a verifying operation of the post-programming operation.

* * * * *